(12) United States Patent
Kuraguchi

(10) Patent No.: US 9,349,807 B2
(45) Date of Patent: May 24, 2016

(54) SEMICONDUCTOR DEVICE HAVING GAN-BASED LAYER

(71) Applicant: Kabushiki Kaisha Toshiba, Minato-ku (JP)

(72) Inventor: Masahiko Kuraguchi, Yokohama (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 0 days.

(21) Appl. No.: 14/447,892

(22) Filed: Jul. 31, 2014

(65) Prior Publication Data

US 2015/0034972 A1  Feb. 5, 2015

(30) Foreign Application Priority Data

Aug. 1, 2013  (JP) ................... 2013-160783

(51) Int. Cl.
| | | |
|---|---|---|
| H01L 29/00 | (2006.01) | |
| H01L 27/06 | (2006.01) | |
| H01L 27/12 | (2006.01) | |
| H01L 29/267 | (2006.01) | |
| H01L 29/78 | (2006.01) | |
| H01L 29/861 | (2006.01) | |
| H01L 29/417 | (2006.01) | |

(Continued)

(52) U.S. Cl.
CPC .......... *H01L 29/267* (2013.01); *H01L 21/8252* (2013.01); *H01L 27/0605* (2013.01); *H01L 27/0629* (2013.01); *H01L 29/1087* (2013.01); *H01L 29/4175* (2013.01); *H01L 29/7786* (2013.01); *H01L 29/78* (2013.01); *H01L 29/861* (2013.01); *H01L 21/8258* (2013.01); *H01L 27/0617* (2013.01); *H01L 27/1203* (2013.01); *H01L 29/0623* (2013.01); *H01L 29/2003* (2013.01); *H01L 29/808* (2013.01)

(58) Field of Classification Search
CPC ..... H01L 29/267; H01L 29/78; H01L 29/861; H01L 27/0605; H01L 27/0617; H01L 27/1203
See application file for complete search history.

(56) References Cited

U.S. PATENT DOCUMENTS

| | | | |
|---|---|---|---|
| 6,465,814 B2 * | 10/2002 | Kasahara et al. ............ | 257/192 |
| 7,084,441 B2 * | 8/2006 | Saxler .......................... | 257/243 |

(Continued)

FOREIGN PATENT DOCUMENTS

| | | |
|---|---|---|
| JP | 2006-196869 | 7/2006 |
| JP | 2007-103451 | 4/2007 |

(Continued)

OTHER PUBLICATIONS

Search Report issued Jan. 27, 2015 in European Patent Application No. 14179099.8.

(Continued)

*Primary Examiner* — Ida M Soward
(74) *Attorney, Agent, or Firm* — Oblon, McClelland, Maier & Neustadt, L.L.P.

(57) ABSTRACT

A semiconductor device includes a first conductivity type semiconductor substrate including one of Si and SiC; a second conductivity type semiconductor region at a surface of the semiconductor substrate, a GaN-based semiconductor layer on the semiconductor substrate, and a lateral semiconductor element at the GaN-based semiconductor layer and above the semiconductor region, the lateral semiconductor element having a first electrode and a second electrode electrically connected to the semiconductor region.

16 Claims, 4 Drawing Sheets

(51) Int. Cl.
*H01L 29/778* (2006.01)
*H01L 29/10* (2006.01)
*H01L 21/8252* (2006.01)
H01L 29/808 (2006.01)
H01L 29/06 (2006.01)
H01L 29/20 (2006.01)
H01L 21/8258 (2006.01)

(56) References Cited

U.S. PATENT DOCUMENTS

| | | | |
|---|---|---|---|
| 7,838,907 B2 * | 11/2010 | Shiraishi | 257/195 |
| 8,314,447 B2 * | 11/2012 | Hirler et al. | 257/194 |
| 8,492,773 B2 * | 7/2013 | Hebert | 257/77 |
| 8,575,657 B2 * | 11/2013 | Gambin et al. | 257/194 |
| 8,866,193 B2 * | 10/2014 | Briere | 257/195 |
| 8,900,939 B2 * | 12/2014 | Kub et al. | 438/172 |
| 8,916,909 B2 * | 12/2014 | Hirler | H01L 21/8258 257/195 |
| 8,937,338 B2 * | 1/2015 | Chowdhury | H01L 29/66204 257/194 |
| 9,166,048 B2 * | 10/2015 | Simin | H01L 29/7786 |
| 2003/0015708 A1 * | 1/2003 | Parikh et al. | 257/73 |
| 2004/0099888 A1 | 5/2004 | Sriram | |
| 2006/0124960 A1 | 6/2006 | Hirose et al. | |
| 2011/0204417 A1 * | 8/2011 | Sato | 257/190 |
| 2011/0210337 A1 * | 9/2011 | Briere | 257/76 |
| 2012/0153300 A1 * | 6/2012 | Lidow et al. | 257/77 |
| 2012/0153355 A1 | 6/2012 | Umeda et al. | |
| 2012/0187451 A1 * | 7/2012 | Saito | 257/192 |
| 2013/0112939 A1 * | 5/2013 | Chen et al. | 257/13 |
| 2013/0153967 A1 * | 6/2013 | Curatola et al. | 257/194 |
| 2013/0168737 A1 * | 7/2013 | Prechtl et al. | 257/194 |
| 2013/0200424 A1 * | 8/2013 | An et al. | 257/99 |
| 2013/0234207 A1 * | 9/2013 | Choi et al. | 257/194 |
| 2013/0299877 A1 * | 11/2013 | Briere | 257/192 |
| 2014/0061724 A1 * | 3/2014 | Huang et al. | 257/194 |
| 2014/0103395 A1 | 4/2014 | Saito | |
| 2014/0103398 A1 * | 4/2014 | Curatola et al. | 257/194 |
| 2014/0361309 A1 * | 12/2014 | Mishra et al. | 257/76 |

FOREIGN PATENT DOCUMENTS

| | | |
|---|---|---|
| JP | 2012-80123 | 4/2012 |
| JP | 2013-16627 | 1/2013 |

OTHER PUBLICATIONS

Office Action mailed Sep. 7, 2015, in European Patent Application 14 179 099.8-1552.

* cited by examiner

SEMICONDUCTOR DEVICE HAVING GAN-BASED LAYER

CROSS-REFERENCE TO RELATED APPLICATION

This application is based upon and claims the benefit of priority from Japanese Patent Application No. 2013-160783, filed on Aug. 1, 2013, the entire contents of which are incorporated herein by reference.

FIELD

Embodiments described herein relate generally to a semiconductor device.

BACKGROUND

GaN-based semiconductors with high breakdown strengths are applied as power electronics semiconductor devices, high frequency power semiconductor devices, and so forth. The GaN-based semiconductors, however, suffer from "current collapse", which is an undesired phenomenon in which application of a high voltage increases an on-resistance and significantly reduces a drain current, and this phenomenon is known to adversely affect the characteristics of semiconductor devices.

DETAILED DESCRIPTION

A semiconductor device according to one aspect of the present disclosure includes: a first conductivity type semiconductor substrate including one of Si and SiC; a second conductivity type semiconductor region at a surface of the semiconductor substrate; a GaN-based semiconductor layer on the semiconductor substrate; and a lateral semiconductor element at the GaN-based semiconductor layer and above the semiconductor region, the lateral semiconductor element having a first electrode electrically connected to the semiconductor region and a second electrode.

The "GaN-based semiconductor" in the specification is a general term for semiconductors including GaN (gallium nitride), AlN (aluminum nitride), InN (indium nitride), or an intermediate composition of the materials.

Further, the "lateral semiconductor element" in the specification means an element in which components such as electrodes are arranged in a horizontal direction with respect to the semiconductor layer and carriers flow in the horizontal direction. The lateral semiconductor element is a concept contrasted with a "vertical semiconductor element", which is an element in which an electrode is formed on the top and bottom surfaces of a semiconductor layer and carriers flow in a vertical direction.

In the meanwhile, it is to be noted that the terms "on", "under", "above", and "below" in the specification indicate relative positional relations between components and do not always refer to longitudinal relations with respect to the direction of gravitational force.

First Embodiment

A semiconductor device according to a first embodiment includes: a first conductivity type semiconductor substrate including one of Si (silicon) and SiC (silicon carbide); a second conductivity type semiconductor region at a surface of the semiconductor substrate; a GaN-based semiconductor layer on the semiconductor substrate; and a lateral semiconductor element at the GaN-based semiconductor layer, having a first electrode electrically connected to the semiconductor region and a second electrode.

An example will be hereinafter described in which the semiconductor substrate is formed of n-type single crystal Si and the lateral semiconductor element is a transistor.

Figure 1:
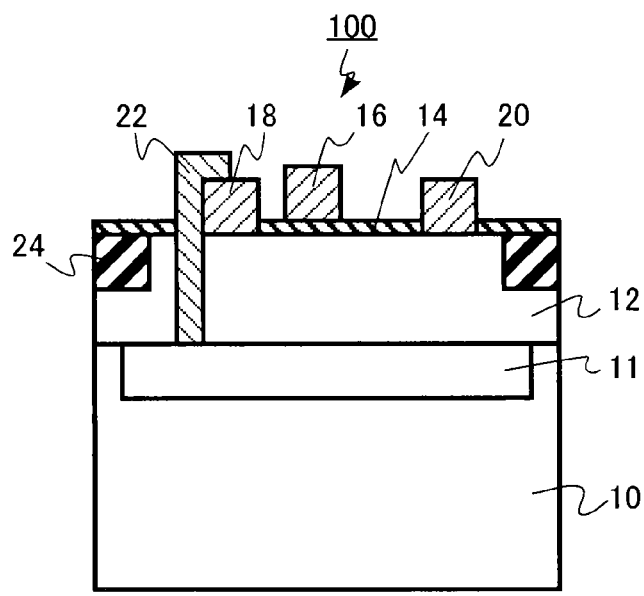
FIG. 1 is a cross-sectional view illustrating a configuration of a semiconductor device according to a first embodiment.

FIG. 1 is a cross-sectional view illustrating the configuration of the semiconductor device according to the first embodiment. The semiconductor device includes a semiconductor substrate 10, a GaN-based semiconductor layer 12, and a transistor 100 in that order. The transistor 100 is an HEMT (high electron mobility transistor) which is a field-effect transistor using a hetero junction. The semiconductor substrate 10 is formed of Si.

At a surface of the semiconductor substrate 10 lies a p-type semiconductor region 11. The p-type semiconductor region 11 is prepared by implanting ions of p-type impurities such as B (boron) into the semiconductor substrate, for example. The p-type semiconductor region 11 is 0.1 μm to 3 μm, for example, in thickness.

On the semiconductor substrate 10, the GaN-based semiconductor layer 12 may be provided with a buffer layer (not shown in the drawing) interposed in between. The buffer layer has a function of relaxing lattice mismatching between the semiconductor substrate 10 and the GaN-based semiconductor layer 12. The buffer layer may have a multilayered structure of $Al_xGa_{1-x}N$ ($0<x<1$) (aluminum gallium nitride), and is 0.3 μm to 3 μm, for example, in thickness.

Further, the GaN-based semiconductor layer 12 has a multilayer structure of an operating layer (channel layer) and a barrier layer (electron supply layer) not shown in the drawing, the operating layer including gallium nitride (GaN), for example, and the barrier layer including AlGaN (aluminum gallium nitride) with an Al composition ratio of 0.15 to 0.4, for example. The barrier layer may include any one of or a combination of gallium nitride (GaN), aluminum gallium nitride ($Al_xGa_{1-x}N$ ($0<x\leq1$)), indium nitride (InN), indium aluminum nitride ($In_yAl_{1-y}N$ ($0<y<1$)), and indium gallium nitride ($In_zGa_{1-z}N$ ($0<z<1$)).

A hetero-junction interface is formed between the operating layer and the barrier layer. The operating layer and the barrier layer are, for example, 0.05 μm to 10 μm and 0.01 μm to 0.05 μm in thickness, respectively.

The buffer layer and the GaN-based semiconductor layer 12 are each a single crystal layer formed by epitaxial growth.

On the GaN-based semiconductor layer 12, a gate electrode 16 is formed with an insulating film 14 interposed in between. The insulating film 14 is formed of silicon nitride (SiN), for example. Other materials including silicon oxide (SiO$_2$) and aluminum oxide (Al$_2$O$_3$) may be used for the insulating film 14. The insulating film 14 functions as a gate insulating film, and has a thickness of 10 nm to 60 nm, for example.

The gate electrode 16 is a metal electrode, for example. The metal electrode contains nickel (Ni), titanium (Ti), titanium nitride (TiN), tungsten (W), or tungsten nitride (WN), for example.

Moreover, on the GaN-based semiconductor layer 12, a source electrode (first electrode) 18 and a drain electrode (second electrode) 20 are provided with the gate electrode 16 in between. The source electrode 18 and the drain electrode 20 are each at a distance from the gate electrode 16.

The source electrode 18 and the drain electrode 20 are metal electrodes, for example, and the metal electrodes contain titanium (Ti), aluminum (Al), tantalum (Ta), or molybdenum (Mo), for example. An ohmic contact is desirably observed between the source electrode 18 and the GaN-based semiconductor layer 12 and between the drain electrode 20 and the GaN-based semiconductor layer 12.

The insulating film 14 is formed as well on the GaN-based semiconductor layer 12 between the source electrode 18 and the gate electrode 16 and between the drain electrode 20 and the gate electrode 16. The insulating film 14 functions as a surface protective film (or passivation film) protecting surfaces of the GaN-based semiconductor layer 12 between the gate electrode 16 and the source electrode 18 and between the gate electrode 16 and the drain electrode 20. On the insulating film 14, there may be provided an insulating film (not shown in the drawing) of silicon nitride (SiN) or silicon oxide (SiO$_2$) having a thickness of 50 nm to 500 nm, for example.

The source electrode (first electrode) 18 is electrically connected to the semiconductor region 11. Specifically, the source electrode 18 is provided above the semiconductor region 11 and is connected to the semiconductor region 11 by a conductive plug 22 extending through the GaN-based semiconductor layer 12.

The conductive plug 22 is a metal electrode, for example, and the metal electrode is mainly composed of aluminum (Al) or gold (Au). The conductive plug 22 is prepared by filling, by sputtering, plating, etc., a metal material into a hole formed in the GaN-based semiconductor layer 12 by dry etching. An insulating layer may be provided between the conductive plug 22 and the GaN-based semiconductor layer 12. An ohmic contact is desirably observed between the conductive plug 22 and the semiconductor region 11.

The source electrode 18 and the semiconductor region 11 have the same electrical potential. The semiconductor substrate 10 is fixed to a ground potential, for example. The semiconductor substrate 10 is preferably fixed to a ground potential so that the operations of the semiconductor elements are made stable. The semiconductor region 11 and the semiconductor substrate 10 are electrically separated from each other by a pn-junction.

Further, the GaN-based semiconductor layer 12 is provided with an element isolation region 24 separating the transistor 100 from elements adjacent to the transistor 100. The element isolation region 24 is formed by ion implantation or mesa structure, for example.

The element isolation region 24 is formed to surround the active region of the transistor 100. Further, the semiconductor region 11 is formed below the active region. The transistor 100 is formed above and preferably immediately on the semiconductor region 11. Moreover, edges of the semiconductor region 11, that is, the boundaries between the semiconductor region 11 and the semiconductor substrate 10 are desirably located immediately below the element isolation region 24. The semiconductor region 11 is preferably included in all of the regions immediately below the active region.

Further, a field plate structure not shown in the drawing may be formed on or above the insulating film 14.

It is known that semiconductor devices using GaN-based semiconductors suffer from occurrence of current collapse, which is a phenomenon in which a drain current is reduced after a high voltage stress is applied between a source electrode and a drain electrode. The current collapse seems to be caused by electrical charge traps formed in current paths of semiconductor devices.

Table 1 shows a relation between current collapse and the potential of a substrate where an HEMT is formed. Semiconductor elements used for the measurement are a GaN operating layer provided on a silicon substrate, and an HEMT formed at an AlGaN barrier layer. The semiconductor elements used for the measurement do not include a layer equivalent to the semiconductor region 11 of the first embodiment. The gate length is 1 µm, the gate width is 3 mm, the distance between the gate electrode and the drain electrode is 15 µm, and the distance between the gate electrode and the source electrode is 1.5 µm.

The stress conditions are set so that the gate voltage is −15 V and the drain voltage is 250 V. Further, for the measurement of an on-state current, on-resistances in the initial stage and after stress application are compared under the conditions that the gate voltage is 0 V and the current value is 0.5 A. The values of current collapse in the table are obtained by dividing the on-resistances after stress application by the initial on-resistances.

Evaluations are made for cases where the potential of the silicon substrate is fixed to the source electrode, the drain electrode, and a floating potential, respectively.

TABLE 1

|  | on-resistance after stress application/initial on-resistance |
| --- | --- |
| Fixed to source electrode | 1.18 |
| Fixed to drain electrode | 2.00 |
| Fixed to floating potential | 1.46 |

As Table 1 shows, fixing the substrate to the source electrode, in particular, increases effects of suppressing the current collapse. This is because the substrate functions as a source field plate, whereby the electric field between the gate electrode and the drain electrode, for example, can be reduced. Hence, the substrate is desirably fixed to the source electrode when the current collapse is to be suppressed.

Figure 2:
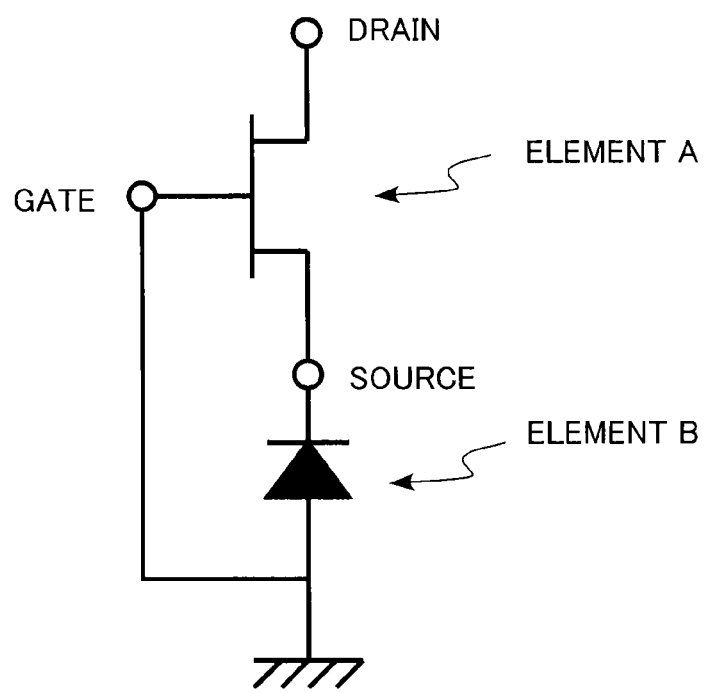
FIG. 2 is a drawing illustrating an example of a circuit using a GaN-based semiconductor.

Note that the circuit configuration makes it difficult to fix the substrate to the source electrode in some cases. FIG. 2 illustrates an example of a circuit using a GaN-based semiconductor.

A semiconductor element A is an HEMT of a GaN-based semiconductor, and a semiconductor element B is a silicon diode. The source electrode of the semiconductor element A is connected to the cathode electrode of the semiconductor element B, and the anode electrode of the semiconductor element B is connected to the gate electrode of the semiconductor element A and is fixed to a ground potential. This rectifying element is so configured as to offer a high breakdown voltage in an off state by an HEMT as the semiconductor element A having a high breakdown voltage higher than that of the diode as the semiconductor element B.

In the circuit of FIG. 2, the source electrode of the HEMT has a variable potential, not a fixed potential. Specifically, if the potential of the source electrode is fixed to the substrate in order to suppress the current collapse, the potential of the substrate is varied with the potential of the source electrode. Hence, when the potential of the substrate with a large parasitic capacitance is changed, charge/discharge take much time, which makes the operations less rapid and increases electric power consumption. Moreover, since the potential is not fixed, external noise is easy to catch and the operations of the semiconductor elements are made unstable. On the other hand, if the potential of the substrate is fixed to the ground of the circuit in order to fix the potential of the substrate, the potential of the gate electrode of the HEMT is connected to the ground of the circuit in FIG. 2. This makes it difficult to effectively suppress the current collapse, as well as makes the operations slower since the parasitic capacitances of the substrate and the drain electrode and of the substrate and the source electrode are added to the capacitance of the gate electrode in parallel.

A case will be examined next where the transistor 100 of the embodiment is applied to the semiconductor element A in FIG. 2. In this case, since the semiconductor substrate 10 and the semiconductor region 11 are electrically separated from each other, it becomes possible to fix the semiconductor substrate 10 to a ground potential and fix the semiconductor region 11 to the source electrode 18. In this way, the semiconductor device according to the embodiment achieves suppression of the current collapse without degrading the characteristics of the semiconductor circuit.

In addition, since the semiconductor region 11 to be fixed to the source electrode 18 is formed in the entire area below the active region, the field plate effects are enhanced and the current collapse can be further suppressed.

Since having a high channel mobility and can therefore have a reduced on-resistance, the HEMT using a heterojunction as in the embodiment is suitable for power electronics semiconductor devices. Also, a high channel mobility is suited for high frequency operations. Although the embodiment uses an HEMT using a two-layered GaN-based semiconductor, the configuration of the embodiment is additionally applicable to GaN-based semiconductors with other structures.

Further, although a transistor having a gate insulating film is used in the embodiment, the present disclosure may select a configuration in which the gate electrode 16 is directly formed on the GaN-based semiconductor layer 12 without a gate insulating film in between.

Second Embodiment

A semiconductor device according to a second embodiment is basically similar to that according to the first embodiment, except in that the lateral semiconductor element is a diode having an anode electrode and a cathode electrode and the first electrode is the anode electrode. Descriptions will be thus omitted of the similarities with the first embodiment.

An example will be described below in which the semiconductor substrate is formed of n-type Si and the lateral semiconductor element is a diode.

Figure 3:
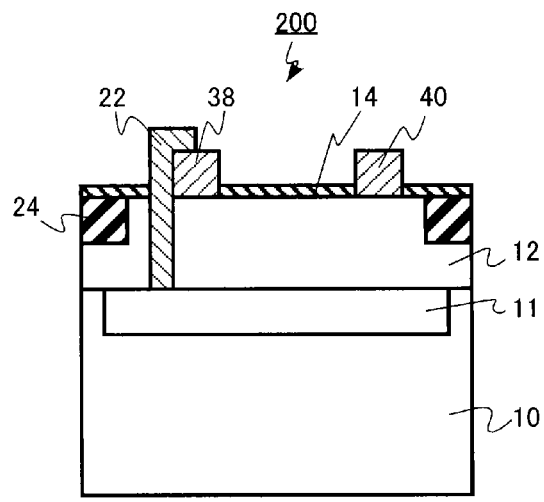
FIG. 3 is a cross-sectional view illustrating a configuration of a semiconductor device according to a second embodiment.

FIG. 3 is a cross-sectional view illustrating the configuration of the semiconductor device according to the second embodiment. In the semiconductor device, a GaN-based semiconductor layer 12 is formed on a semiconductor substrate 10 and a diode 200 is formed at the GaN-based semiconductor layer 12.

At a surface of the semiconductor substrate 10 lies a p-type semiconductor region 11. On the semiconductor substrate 10, a GaN-based semiconductor layer 12 is provided with a buffer layer (not shown in the drawing) interposed in between.

Further, on the GaN-based semiconductor layer 12, an anode electrode 38 as a first electrode and a cathode electrode 40 as a second electrode are provided.

The anode electrode 38 is, for example, a metal electrode containing nickel (Ni), platinum (Pt), tungsten (W), or titanium nitride (TiN), and the cathode electrode 40 is, for example, a metal electrode containing titanium (Ti), aluminum (Al), tantalum (Ta), or molybdenum (Mo). An ohmic contact is desirably observed between the anode electrode 38 and the GaN-based semiconductor layer 12 and between the cathode electrode 40 and the GaN-based semiconductor layer 12.

An insulating film 14 is formed on the GaN-based semiconductor layer 12 between the anode electrode 38 and the cathode electrode 40. The insulating film 14 is made of silicon nitride (SiN), for example. Other materials such as silicon oxide ($SiO_2$) and aluminum oxide ($Al_2O_3$) may be employed for the insulating film 14. The insulating film 14 functions as a surface protective film (or passivation film) protecting a surface of the GaN-based semiconductor layer 12. On the insulating film 14, there may be provided an insulating film (not shown in the drawing) of silicon nitride (SiN) or silicon oxide ($SiO_2$) having a thickness of 50 nm to 500 nm, for example.

The anode electrode 38 as the first electrode is electrically connected to the semiconductor region 11. Specifically, the anode electrode 38 is provided above the semiconductor region 11 and is connected to the semiconductor region 11 by a conductive plug 22 extending through the GaN-based semiconductor layer 12.

The conductive plug 22 is a metal electrode, for example, and the metal electrode is mainly composed of aluminum (Al) or gold (Au). The conductive plug 22 is prepared by filling, by sputtering, plating, etc., a metal material into a hole formed in the GaN-based semiconductor layer 12 by dry etching. An insulating layer may be provided between the conductive plug 22 and the GaN-based semiconductor layer 12.

The anode electrode 38 and the semiconductor region 11 have the same potential. The semiconductor substrate 10 is fixed to a ground potential, for example. The semiconductor region 11 and the semiconductor substrate 10 are electrically separated from each other by a pn-junction.

Further, the GaN-based semiconductor layer 12 is provided with an element isolation region 24 dividing the diode 200 from elements adjacent to the diode 200. The element isolation region 24 is formed by ion implantation or mesa structure, for example.

In the diode of the GaN-based semiconductor, current collapse occurs as in the case of the transistor, which degrades the forward characteristic of semiconductor elements. Fixing the anode electrode to the substrate is effective for suppressing the current collapse.

According to the diode of the embodiment, the semiconductor region 11 formed in the semiconductor substrate 10 is electrically connected to and is fixed to the anode electrode 38. Further, the semiconductor substrate 10 can be fixed to a different potential such as a ground potential. Hence, it becomes possible to suppress the current collapse without degrading the characteristics of the semiconductor circuit.

Third Embodiment

A semiconductor device according to a third embodiment includes: a first conductivity type semiconductor substrate including one of Si and SiC; first and second semiconductor regions of a second conductivity type in a surface of the semiconductor substrate; a GaN-based semiconductor layer on the semiconductor substrate; and a first lateral semiconductor element at the GaN-based semiconductor layer, having a first electrode and a second electrode electrically connected to the first semiconductor region; and a second lateral semiconductor element at the GaN-based semiconductor layer, having a third electrode and a fourth electrode electrically connected to the second semiconductor region.

Next, a case will be described in which the semiconductor substrate is formed of n-type Si and the first and second lateral semiconductor elements are transistors. Descriptions will be omitted of the similarities with the first embodiment, such as the structures of the transistors.

Figure 4:
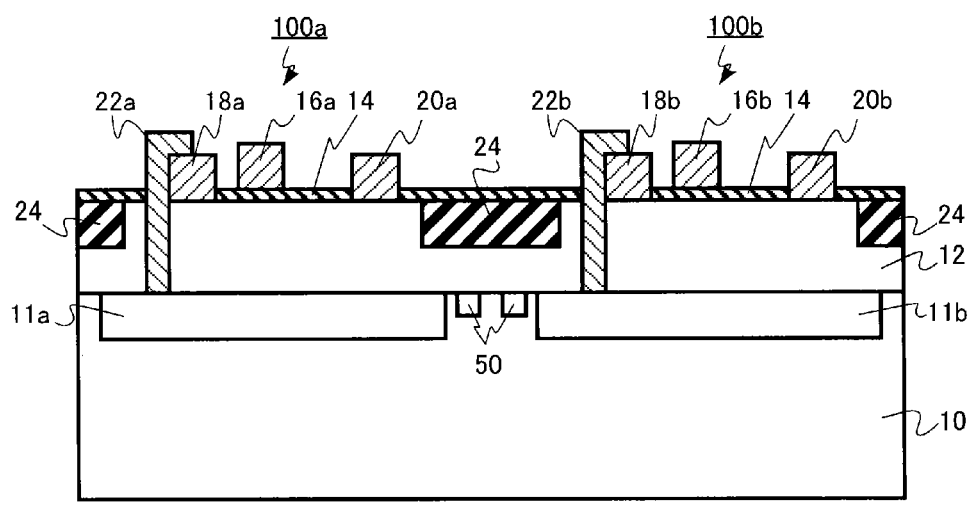
FIG. 4 is a cross-sectional view illustrating a configuration of a semiconductor device according to a third embodiment.

FIG. 4 is a cross-sectional view illustrating the configuration of the semiconductor device according to the third embodiment. In the semiconductor device, a GaN-based semiconductor layer 12 is formed on a semiconductor substrate 10, and a first transistor 100a and a second transistor 100b are formed at the GaN-based semiconductor layer 12. The first and second transistors 100a and 100b are high electron mobility transistors (HEMTs). The semiconductor substrate 10 is formed of Si.

At a surface of the semiconductor substrate 10, a p-type first semiconductor region 11a and a p-type second semiconductor region 11b are formed. The p-type first and second semiconductor regions 11a and 11b are physically and electrically separated from each other with the semiconductor substrate 10 interposed in between.

A guard ring structure may be formed in a manner that p-type regions 50 are provided in a surface of the semiconductor substrate 10 between the p-type first semiconductor region 11a and the p-type second semiconductor region 11b. The presence of the guard ring structure can achieve improvement of the breakdown voltages between the p-type first semiconductor region 11a and the semiconductor substrate 10 and between the p-type second semiconductor region 11b and the semiconductor substrate 10.

The first transistor 100a includes a first source electrode 18a as a first electrode, a first gate electrode 16a, and a first drain electrode 20a as a second electrode. Further, the second transistor 100b includes a second source electrode 18b as a third electrode, a second gate electrode 16b, and a second drain electrode 20b as a fourth electrode.

An insulating film 14 is provided between the first source electrode (first electrode) 18a and the first drain electrode (second electrode) 20a. Further, the insulating film 14 is formed as well between the second source electrode (third electrode) 18b and the second drain electrode (fourth electrode) 20b.

The first source electrode (first electrode) 18a is electrically connected to the first semiconductor region 11a. Specifically, the first source electrode 18a is provided above the first semiconductor region 11a and is connected to the first semiconductor region 11a by a first conductive plug 22a extending through the GaN-based semiconductor layer 12.

The second source electrode (third electrode) 18b is electrically connected to the second semiconductor region 11b. Specifically, the second source electrode 18b is provided above the second semiconductor region 11b and is connected to the second semiconductor region 11b by a second conductive plug 22b extending through the GaN-based semiconductor layer 12.

The first source electrode (first electrode) 18a and the first semiconductor region 11a have the same potential, and the second source electrode (third electrode) 18b and the second semiconductor region 11b have the same potential. The semiconductor substrate 10 is fixed to a ground potential, for example. The semiconductor substrate 10 is preferably fixed to a ground potential so that the operations of the circuit are made stable. The first and second semiconductor regions 11a and 11b are electrically separated from the semiconductor substrate 10 by a pn-junction.

An element isolation region 24 is formed in the GaN-based semiconductor layer 11 to surround each of the first transistor 100a and the second transistor 100b. The element isolation region 24 physically and electrically separates the first and second transistors 100a and 100b from each other.

The element isolation region 24 is formed so as to surround the active regions of the first and second transistors 100a and 100b. Further, respective edges of the first and second semiconductor regions 11a and 11b are located immediately below the element isolation region 24.

The semiconductor device according to the third embodiment enables suppression of current collapse without degrading the characteristics of the semiconductor circuit, as in the first embodiment. In particular, when the source electrode 18a of the first transistor 100a and the source electrode 18b of the second transistor 100b, which are provided on the same GaN-based semiconductor layer 11, operate at different potentials, the first and second source electrodes 18a and 18b are respectively fixed to the first and second semiconductor regions 11a and 11b electrically separated from each other. Since this structure prevents the parasitic capacitances of the substrate and the electrodes from affecting each other between the two transistors, inhibitions of the operations between the transistors can be avoided.

Moreover, since the first and second semiconductor regions 11a and 11b to be fixed to the first and second source electrodes 18a and 18b, respectively, are formed in the entire area below the active regions as in the first embodiment, the field plate effects are enhanced and the current collapse can be further prevented.

Fourth Embodiment

A semiconductor device according to a fourth embodiment is basically similar to that according to the third embodiment, except in that the semiconductor device according to the fourth embodiment includes a transistor with a multi-finger structure having a comb-like gate electrode. Descriptions will be thus omitted of the similarities with the third embodiment.

Figure 5:
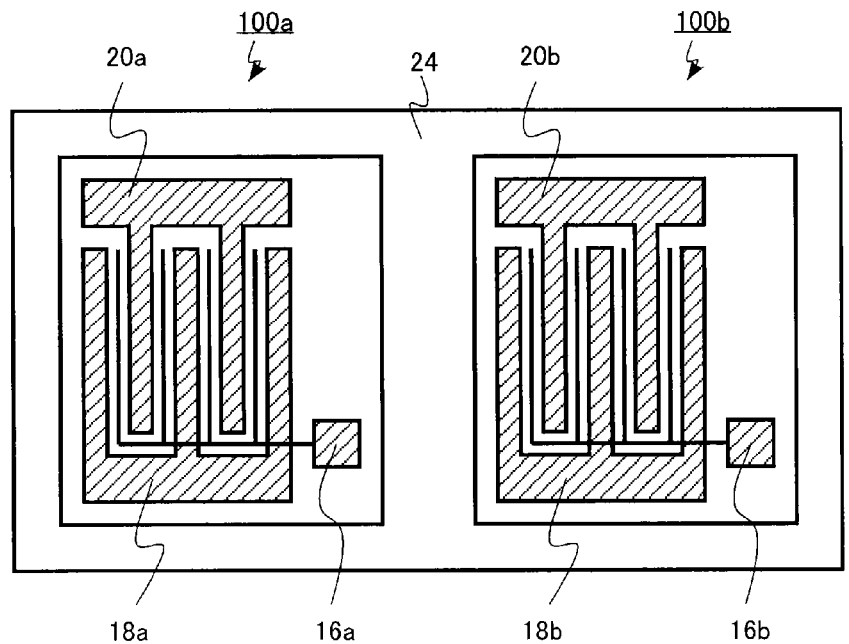
FIG. 5 is a top view illustrating a configuration of a semiconductor device according to a fourth embodiment.

FIG. 5 is a top view illustrating the configuration of the semiconductor device according to the fourth embodiment. In the semiconductor device, a first transistor 100a and a second transistor 100b are formed at a GaN-based semiconductor layer. The first and second transistors 100a and 100b are surrounded by an element isolation region 24.

The first transistor 100a includes a first source electrode 18a as a first electrode, a first gate electrode 16a, and a first drain electrode 20a as a second electrode, the first gate electrode 16a having a multi-finger structure.

Moreover, the second transistor 100b includes a second source electrode 18b as a third electrode, a second gate electrode 16b, and a second drain electrode 20b as a fourth electrode, the second gate electrode 16b having a multi-finger structure.

The semiconductor device according to the fourth embodiment achieves high-current flow by the multi-finger structure, in addition to the effects obtained in the third embodiment.

Fifth Embodiment

A semiconductor device according to a fifth embodiment is basically similar to that according to the third embodiment, except in that the first lateral semiconductor element is a transistor and the second lateral semiconductor element is a diode. Descriptions will be thus omitted of the similarities with the third embodiment, as well as the similarities with the first and second embodiments such as the structures of the transistor and the diode.

Figure 6:
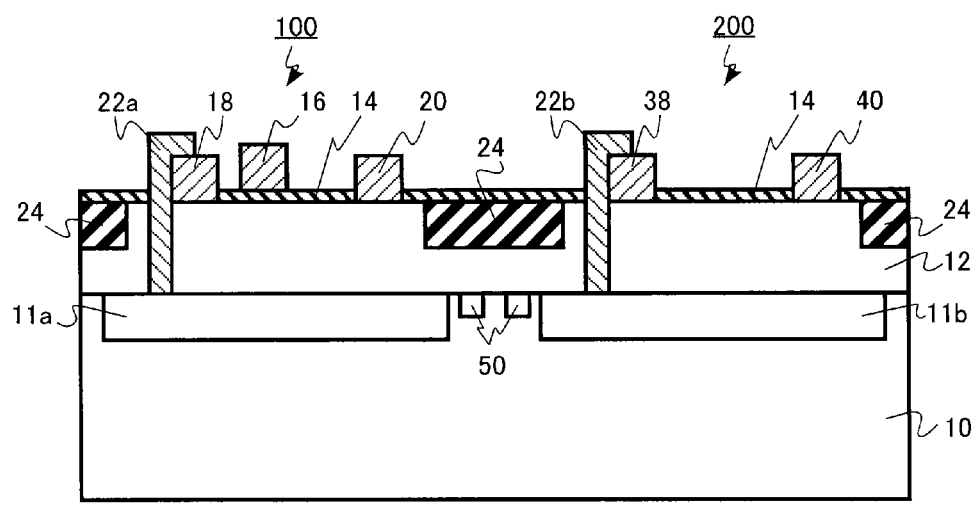
FIG. 6 is a cross-sectional view illustrating a configuration of a semiconductor device according to a fifth embodiment.

FIG. 6 is a cross-sectional view illustrating the configuration of the semiconductor device according to the fifth embodiment. In the semiconductor device, a GaN-based semiconductor layer 12 is formed on a semiconductor substrate 10, and a transistor 100 and a diode 200 are formed at the GaN-based semiconductor layer 12.

At a surface of the n-type semiconductor substrate 10, a p-type first semiconductor region 11a and a p-type second semiconductor region 11b are provided.

The transistor 100a includes a source electrode 18 as a first electrode, a gate electrode 16, and a drain electrode 20 as a second electrode. The diode 200 includes an anode electrode 38 as a third electrode and a cathode electrode 40 as a fourth electrode.

An insulating film 14 is provided between the source electrode (first electrode) 18 and the drain electrode (second electrode) 20 and between the anode electrode (third electrode) 38 and the cathode electrode (fourth electrode) 40.

The source electrode (first electrode) 18 is electrically connected to the first semiconductor region 11a. Specifically, the source electrode 18 is provided above the first semiconductor region 11a and is connected to the first semiconductor region 11a by a first conductive plug 22a extending through the GaN-based semiconductor layer 12.

The anode electrode (third electrode) 38 is electrically connected to the second semiconductor region 11b. Specifically, the anode electrode 38 is provided above the second semiconductor region 11b and is connected to the second semiconductor region 11b by a second conductive plug 22b extending through the GaN-based semiconductor layer 12.

The source electrode (first electrode) 18 and the first semiconductor region 11a have the same potential, and the anode electrode (third electrode) 38 and the second semiconductor region 11b have the same potential. The semiconductor substrate 10 is fixed to a ground potential, for example. The first and second semiconductor regions 11a and 11b are separated from the semiconductor substrate 10 by a pn-junction.

The semiconductor device according to the fifth embodiment enables suppression of current collapse without degrading the characteristics of the semiconductor circuit, as in the third embodiment. In addition, since the first semiconductor region 11a and the second semiconductor region 11b to be fixed to the source electrode 18 and the anode electrode 38, respectively are formed in the entire area below the active regions, the field plate effects are enhanced and the current collapse can be further suppressed, as in the third embodiment.

Sixth Embodiment

A semiconductor device according to a sixth embodiment is basically similar to that according to the third embodiment, except in that a semiconductor substrate is an SOI (Silicon-On-Insulator) substrate. Descriptions will be thus omitted of the similarities with the third embodiment.

Figure 7:
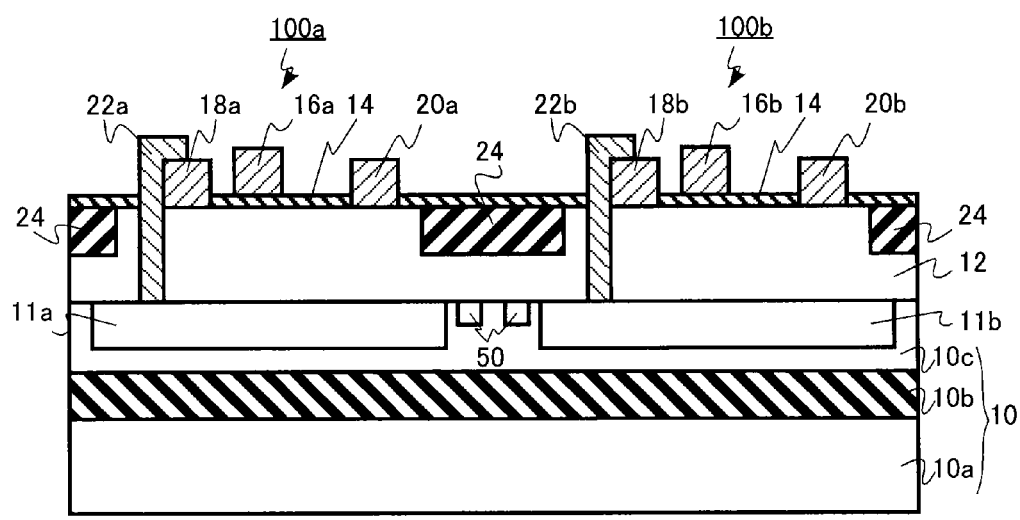
FIG. 7 is a cross-sectional view illustrating a configuration of a semiconductor device according to a sixth embodiment.

FIG. 7 is a cross-sectional view illustrating the configuration of the semiconductor device according to the sixth embodiment. In the semiconductor device, a semiconductor substrate 10 is an SOI substrate having a silicon substrate 10a, a buried layer 10b, and an SOI layer 10c, the buried layer 10b including silicon oxide and the SOI layer 10c including silicon, for example.

The first and second semiconductor regions 11a and 11b are provided in the SOI layer 10c, and may be or may not be in contact with the buried layer 10b at their bottom surfaces as shown in FIG. 7.

The semiconductor device according to the sixth embodiment enables suppression of current collapse without degrading the characteristics of the semiconductor circuit, as in the third embodiment. In addition, since being formed in the SOI layer 10c, the first semiconductor region 11a and the second semiconductor region 11b can each have an increased breakdown voltage. Moreover, since restriction of extension of a depletion layer by the buried layer 10b can further reduce the parasitic capacitance with the substrate, the circuit operation can be improved and the power consumption can be reduced.

In particular, forming the first and second semiconductor regions 11a and 11b so as to be in contact with the buried layer 10b at their bottom surfaces allows reduction in the pn-junction area of the first and second semiconductor regions 11a and 11b. Therefore, the breakdown voltage and the circuit operation can be further increased as well as the power consumption can be further reduced.

Although the embodiments use an HEMT as a transistor, the present disclosure is also applicable to IGBTs (Insulated Gate Bipolar Transistors).

Moreover, although the embodiments use an Si substrate, an SiC substrate may be employed instead.

Furthermore, although the embodiments use an n-type semiconductor substrate and a p-type semiconductor region, the semiconductor substrate may be p-type and the semiconductor region may be n-type. Which configuration to employ should be adequately selected according to conditions such as a potential relation between the semiconductor substrate and the semiconductor region.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a first conductivity type semiconductor substrate including one of Si and SiC;
   a second conductivity type semiconductor region at a surface of the semiconductor substrate;
   a GaN-based semiconductor layer on the semiconductor substrate; and
   a lateral semiconductor element provided at the GaN-based semiconductor layer and above the semiconductor region, the lateral semiconductor element having a first electrode and a second electrode provided on the GaN-based semiconductor layer, the first electrode being electrically connected to the semiconductor region.

2. The device according to claim 1, further comprising an insulating film between the first electrode and the second electrode on the GaN-based semiconductor layer.

3. The device according to claim 1, further comprising a conductive plug on the semiconductor region, the conductive plug extending through the GaN-based semiconductor layer and electrically connecting the first electrode and the semiconductor region.

4. The device according to claim 1, further comprising an element isolation region surrounding the lateral semiconductor element, wherein
a whole edge of the semiconductor region at the surface of the semiconductor substrate is immediately below the element isolation region.

5. The device according to claim 1, wherein the lateral semiconductor element is a transistor having a source electrode, a gate electrode, and a drain electrode, the source electrode being the first electrode.

6. The device according to claim 1, wherein the lateral semiconductor element is a diode having an anode electrode and a cathode electrode, the anode electrode being the first electrode.

7. The device according to claim 1, wherein the semiconductor substrate is fixed to a ground potential.

8. The device according to claim 1, wherein the semiconductor substrate is an SOI substrate and the semiconductor region is formed in an SOI layer of the SOI substrate.

9. The device according to claim 1, comprising:
a second semiconductor region of a second conductivity type at the surface of the semiconductor substrate; and
a second lateral semiconductor element provided at the GaN-based semiconductor layer and above the second semiconductor region, the second lateral semiconductor element having a third electrode and a fourth electrode provided on the GaN-based semiconductor layer, the third electrode being electrically connected to the second semiconductor region.

10. The device according to claim 9, further comprising an insulating film between the first electrode and the second electrode and between the third electrode and the fourth electrode on the GaN-based semiconductor layer.

11. The device according to claim 9, further comprising a first conductive plug on the first semiconductor region and a second conductive plug on the second semiconductor region, the first conductive plug extending through the GaN-based semiconductor layer and electrically connecting the first electrode and the semiconductor region, and the second conductive plug extending through the GaN-based semiconductor layer and electrically connecting the third electrode and the second semiconductor region.

12. The device according to claim 9, further comprising an element isolation region in the GaN-based semiconductor layer, wherein
the element isolation region surrounds the lateral semiconductor element and the second lateral semiconductor element, and
respective edges of the semiconductor region and the second semiconductor region are located immediately below the element isolation region.

13. The device according to claim 9, wherein
the lateral semiconductor element is a transistor having a first source electrode, a first gate electrode, and a first drain electrode, the first source electrode being the first electrode, and
the second lateral semiconductor element is a transistor having a second source electrode, a second gate electrode, and a second drain electrode, the second source electrode being the third electrode.

14. The device according to claim 9, wherein
the lateral semiconductor element is a transistor having a source electrode, a gate electrode, and a drain electrode, the source electrode being the first electrode, and
the second lateral semiconductor element is a diode having an anode electrode and a cathode electrode, the anode electrode being the third electrode.

15. The device according to claim 9, wherein the semiconductor substrate is fixed to a ground potential.

16. The device according to claim 9, wherein
the semiconductor substrate is an SOI substrate, and
the semiconductor region and the second semiconductor region are provided in an SOI layer of the SOI substrate.

* * * * *